United States Patent
Goldrian et al.

(10) Patent No.: US 9,245,820 B2
(45) Date of Patent: Jan. 26, 2016

(54) LIQUID DIMM COOLING DEVICE

(75) Inventors: Gottfried Goldrian, München (DE); Erika Goldrian, legal representative, München (DE); Manfred Ries, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 13/583,021

(22) PCT Filed: Feb. 4, 2011

(86) PCT No.: PCT/EP2011/051646
§ 371 (c)(1),
(2), (4) Date: Oct. 15, 2012

(87) PCT Pub. No.: WO2011/110390
PCT Pub. Date: Sep. 15, 2011

(65) Prior Publication Data
US 2013/0027870 A1   Jan. 31, 2013

(30) Foreign Application Priority Data
Mar. 8, 2010 (EP) .................................... 10155739

(51) Int. Cl.
*G06F 1/20* (2006.01)
*H05K 7/20* (2006.01)
(Continued)

(52) U.S. Cl.
CPC ............ *H01L 23/473* (2013.01); *H01L 23/467* (2013.01); *H05K 7/2039* (2013.01); *H05K 7/20127* (2013.01); *H01L 2924/0002* (2013.01)

(58) Field of Classification Search
CPC ..................... H01L 23/473; H01L 2924/0002; H01L 2924/00; H01L 23/467; H05K 7/2039; H05K 7/20127

USPC ................. 257/707, 719; 361/699, 702, 707, 361/709–711, 715, 719, 720, 679.53, 361/679.54
See application file for complete search history.

(56) References Cited

U.S. PATENT DOCUMENTS 5,710,693 A * 1/1998 Tsukada et al. .......... 361/679.32
5,896,274 A * 4/1999 Ishida ............................ 361/737
(Continued)

FOREIGN PATENT DOCUMENTS

DE    10319984 A1    12/2004
DE   102007050241 A1    1/2009
(Continued)

OTHER PUBLICATIONS

International Business Machines Corporation, International Appl. No. PCT/EP2011/051646, "PCT International Search Report and Written Opinion", Jun. 1, 2011, 13 pages.
(Continued)

*Primary Examiner* — Anatoly Vortman
(74) *Attorney, Agent, or Firm* — Jeffrey L. Streets

(57) ABSTRACT

A liquid cooling device comprises a heat spreader disposed along a plurality of memory modules on a dual in-line memory module (DIMM), a cold rail block extending along the heat spreader and a compressible thermal adapter interleaved between the cold rail block and the memory modules. The thermal adapter is compressible in a direction perpendicular to the plane of the DIMM board, thus allowing the components of the cooling device to be moved and adjusted relative to each other in a direction perpendicular to the plane of the DIMM. In a preferred embodiment, matching smooth surfaces of adjacent components within the cooling device are collated with a lubricant, thus permitting a low-friction gliding of these components relative to each other and allowing the DIMM to be easily removed from the cooling device and to be replaced without effort and without tooling.

11 Claims, 4 Drawing Sheets

(51) Int. Cl.
*H01L 23/473* (2006.01)
*H01L 23/467* (2006.01)

(56) References Cited

U.S. PATENT DOCUMENTS

| | | | |
|---|---|---|---|
| 6,119,765 A * | 9/2000 | Lee | 165/80.3 |
| 6,191,478 B1 | 2/2001 | Chen | |
| 6,233,150 B1 * | 5/2001 | Lin et al. | 361/704 |
| 6,269,001 B1 * | 7/2001 | Matteson et al. | 361/695 |
| 6,377,460 B1 * | 4/2002 | Pohl et al. | 361/704 |
| 7,023,700 B2 * | 4/2006 | Chiou et al. | 361/704 |
| 7,215,551 B2 * | 5/2007 | Wang et al. | 361/707 |
| 7,257,002 B2 | 8/2007 | Nagahashi | |
| 7,345,882 B2 * | 3/2008 | Lee et al. | 361/710 |
| 7,349,219 B2 * | 3/2008 | Lai et al. | 361/719 |
| 7,349,220 B2 * | 3/2008 | Lai et al. | 361/719 |
| 7,369,411 B2 | 5/2008 | Hill et al. | |
| 7,382,617 B2 * | 6/2008 | Yu et al. | 361/704 |
| 7,443,023 B2 * | 10/2008 | Wehrly et al. | 257/707 |
| 7,609,523 B1 * | 10/2009 | Ni et al. | 361/715 |
| 7,755,897 B2 * | 7/2010 | Chen et al. | 361/707 |
| 7,768,785 B2 * | 8/2010 | Ni et al. | 361/715 |
| 7,911,798 B2 * | 3/2011 | Chang et al. | 361/719 |
| 7,933,125 B2 | 4/2011 | Wei et al. | |
| 7,957,134 B2 * | 6/2011 | Farnsworth et al. | 361/679.54 |
| 8,059,403 B2 * | 11/2011 | Chou et al. | 361/695 |
| 2002/0001180 A1 | 1/2002 | Kawamura | |
| 2002/0039282 A1 * | 4/2002 | Han et al. | 361/719 |
| 2003/0026076 A1 * | 2/2003 | Wei | 361/704 |
| 2004/0130873 A1 * | 7/2004 | Hsueh | 361/697 |
| 2004/0250989 A1 * | 12/2004 | Im et al. | 165/80.1 |
| 2005/0117303 A1 | 6/2005 | Nagahashi | |
| 2005/0276021 A1 * | 12/2005 | Gates et al. | 361/709 |
| 2006/0056154 A1 * | 3/2006 | Foster et al. | 361/700 |
| 2006/0203454 A1 * | 9/2006 | Chang | 361/707 |
| 2006/0250772 A1 | 11/2006 | Salmonson et al. | |
| 2007/0195489 A1 * | 8/2007 | Lai et al. | 361/600 |
| 2007/0223198 A1 * | 9/2007 | Lai et al. | 361/720 |
| 2008/0013282 A1 * | 1/2008 | Hoss et al. | 361/715 |
| 2008/0074848 A1 | 3/2008 | Park et al. | |
| 2008/0084668 A1 | 4/2008 | Campbell et al. | |
| 2008/0101036 A1 * | 5/2008 | Chen | 361/720 |
| 2008/0251911 A1 | 10/2008 | Farnsworth et al. | |
| 2009/0002951 A1 | 1/2009 | Legen et al. | |
| 2009/0129026 A1 * | 5/2009 | Baek et al. | 361/710 |
| 2009/0277616 A1 | 11/2009 | Cipolla et al. | |
| 2010/0025010 A1 | 2/2010 | Cipolla | |

FOREIGN PATENT DOCUMENTS

| | | | |
|---|---|---|---|
| JP | 1270298 A | 10/1989 | |
| JP | 8264981 A | 10/1996 | |
| JP | 2004079940 A | 3/2004 | |
| JP | 2010040886 A | 2/2010 | |
| WO | WO2011110390 A1 | 9/2011 | |

OTHER PUBLICATIONS

NCE Corp, "Cooling Structure for Semiconductor Element" English Abstract of JPH01270298(A), Oct. 27, 1989, 2 pages.
PCT "International Preliminary Report on Patentability" The International Bureau of WIPO, Switzerland, Sep. 20, 2012, 7 pages.
NEC Corp, "Cooling Structure for Semiconductor Element", English Abstract of JP1270298(A), Oct. 27, 1989, Espacenet Bibliographic data, 1 page.
Mitsubishi Electric Corp, "Electronic Equipment" English Abstract of JP8264981(A), Oct. 11, 1996, Espacenet Bibliographic data, 2 pages.
Elpida Memory Inc, "Memory-Module Heat Radiating Device", English Abstract of JP2004079940(A), Mar. 11, 2004, Espacenet Bibliographic data, 1 page.
Elpida Memory Inc, "Memory Module Heatsink Device", English Abstract of JP2005116704(A), Apr. 28, 2005, Espacenet Bibliographic data, 2 pages.
Fujitsu Ltd, "Memory Module Heatsink Device", English Abstract of JP20092330505(A), Oct. 8, 2009, Espacenet Bibliographic data, 2 pages.
Hitachi Ltd, "Electronic Device", English Abstract of JP2010040886(A), Feb. 18, 2010, Espacenet Bibliographic data, 2 pages.
International Business Machines Corporation "UK Intellectual Property Office—'Response to the Examination Report'", Appl. No. GB1211726.3, Portsmouth, Hampshire, Oct. 10, 2013, 5 pages. (This UK application is related to the present U.S. Appl. No. 13/583,021).
UK Intellectual Property Office, "Examination Report under Section 18(3)", Patents Directorate, Newport, South Wales, Application No: GB1211726.3, Sep. 30, 2013, 2 pages. (This Uk application is related to the present U.S. Appl. No. 13/583,021).

\* cited by examiner

LIQUID DIMM COOLING DEVICE

BACKGROUND

1. Field of the Invention

The present invention relates generally to cooling of electronic components, and specifically to a liquid cooling device for electronic circuit boards.

2. Background of the Related Art

Microelectronic components such as memory modules contained in computers and electronic devices generate substantial amounts of heat during operation which must be removed in order to ensure reliable performance and a long lifetime of the components. In the past, this has been achieved by using air cooling, for example with fans forcing an air flow through the electronic device. However, these air cooling arrangements have been found to consume a considerable amount of space and/or fail to adequately cool the microelectronic components. In particular, usage of densely packed powerful microelectronic components such as dual in-line memory modules (DIMMs) requires a powerful cooling system.

A DIMM is a narrow elongated electronic circuit board which holds memory modules on both of its sides. Due to the high density and close vicinity of powerful memory modules on the circuit board, DIMMs need reliable and highly effective cooling which is difficult to implement using air flow cooling.

BRIEF SUMMARY

One embodiment of the present invention provides a liquid cooling device comprising a heat spreader disposed along the plurality of memory modules on a dual in-line memory module, a cold rail block extending along the heat spreader and a compressible thermal adapter interleaved between the cold rail block and the memory modules of the DIMM.

BRIEF DESCRIPTION OF THE SEVERAL VIEWS OF THE DRAWINGS

The present invention may best be understood from the following detailed description of the embodiments, but the invention shall not be restricted to these embodiments. In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

FIG. 2b is a sectional view of the liquid cooling device of FIG. 2a along plane IIb-IIb in FIG. 2a.

FIG. 2c is a perspective side view of a cold rail block contained in the liquid cooling device of FIG. 2a.

FIG. 3a is a perspective side view of a liquid cooling device according to an alternate embodiment.

FIG. 3b is a perspective view of a DIMM with a sheathing assembly forming part of the liquid cooling device of FIG. 3a.

DETAILED DESCRIPTION

One embodiment of the present invention provides a liquid cooling device comprising a heat spreader disposed along the plurality of memory modules on a dual in-line memory module, a cold rail block extending along the heat spreader and a compressible thermal adapter interleaved between the cold rail block and the memory modules of the DIMM.

The compressibility of the thermal adapter interleaved between the cold rail and the DIMM allows the components of the cooling device to be moved and adjusted relative to each other in a direction perpendicular to the plane of the DIMM's circuit boards. The compressible adapter thus acts like a spring which holds the components in place and assures good mechanical and thermal contact. The compressible adapter thus compensates dimensional differences and inaccuracies of the various components of the liquid cooling device. By manually compressing the adapter, the DIMM may be removed from the cooling device. In a preferred embodiment, selective components within the cooling device possess matching smooth surfaces which permit a low-friction gliding of these components relative to each other. This allows the DIMM to be easily removed from the cooling device and to be replaced without effort and without tooling.

Figure 1:
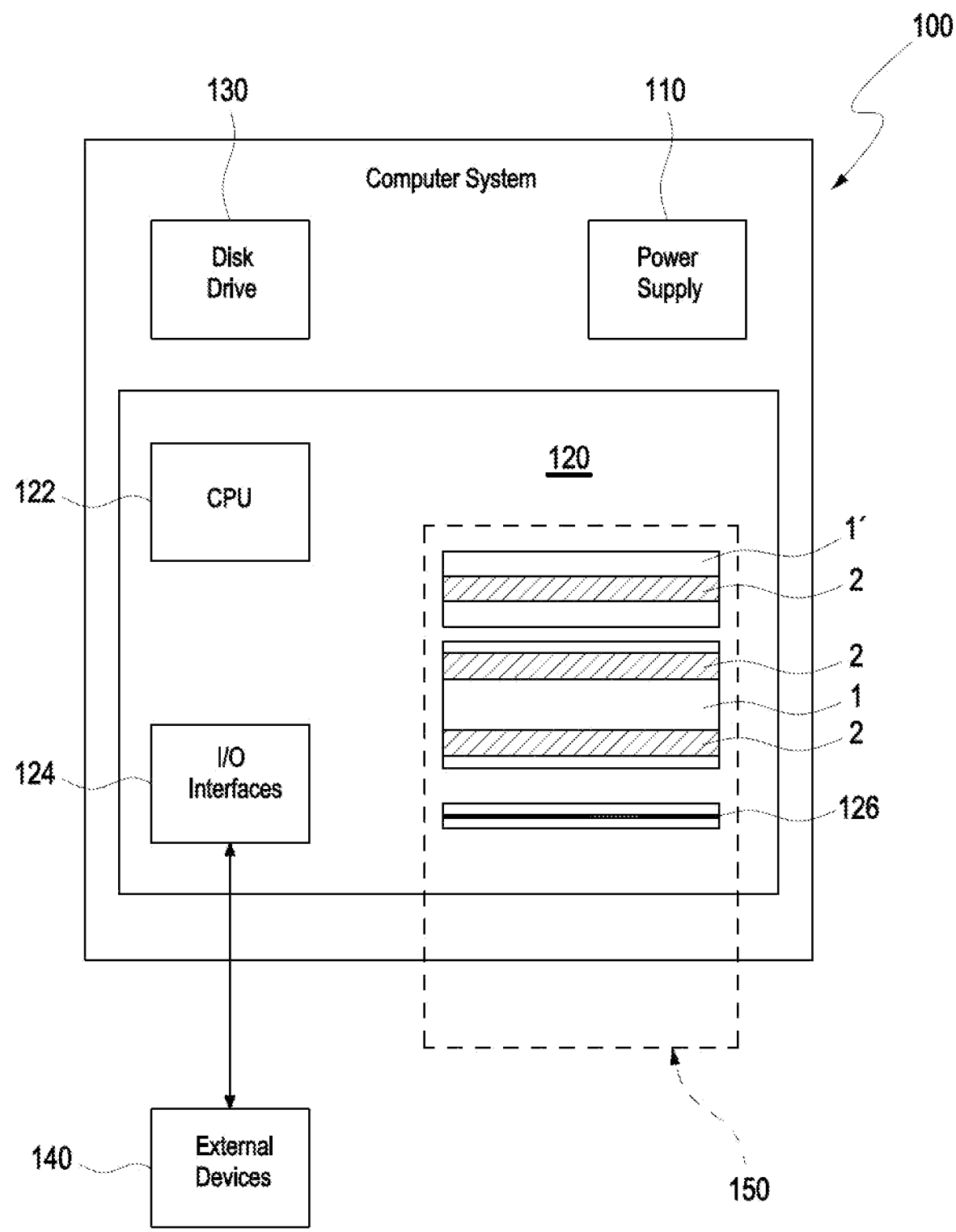
FIG. 1 is a schematic diagram of a computer system with a motherboard containing heat generating components and a cooling system.

FIG. 1 is a schematic diagram of an embodiment of a computer system 100 comprising various electronic components and modules that generate heat during operation. The computer system 100 generally comprises a power supply 110, a motherboard 120 and a plurality of storage media 130 such as magnetic and/or optical disk drive 130. The motherboard 120 contains a variety of electronic components such as a central processing unit (CPU) 122, input/output (I/O) interfaces 124 for accessing external devices/resources 140 such as keyboard, mouse, voice recognition system, printer, monitor, facsimile etc. as well as dual in-line memory modules (DIMMs) 2 mounted into sockets 126 in motherboard 120. The standard arrangement of these DIMM sockets 126 results in the DIMMs being aligned parallel to each other and perpendicular to the plane of the motherboard 120. FIG. 1 shows three DIMMs 2 mounted on the motherboard 120 as well as one empty slot socket 126. The computer system 100 is equipped with a liquid cooling system 150 for cooling electronic components of the computer system 100. Liquid cooling system 150 comprises liquid cooling devices 1, 1' designed in such a way that they accomplish effective cooling of the DIMMs 2 while enabling fast and easy exchange of the DIMMs. Two preferred embodiments of such liquid cooling devices 1, 1' will be explained in detail with reference to FIGS. 2a-2c and FIGS. 3a and 3b.

Figure 2A:
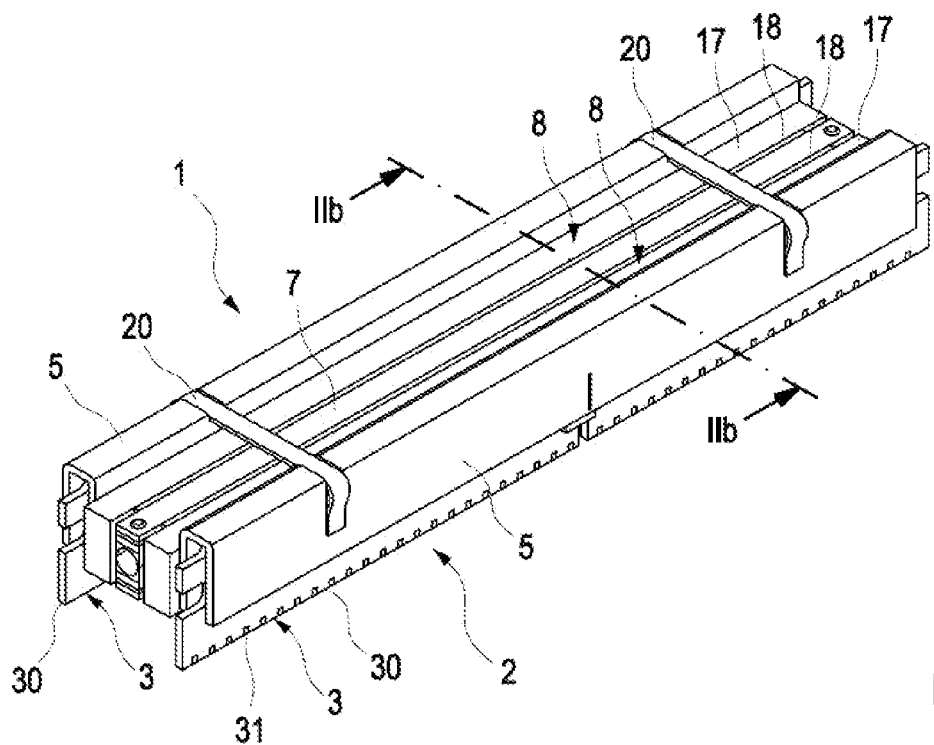
FIG. 2a is a perspective side view of a liquid cooling device according to a first embodiment.
Figure 2B:
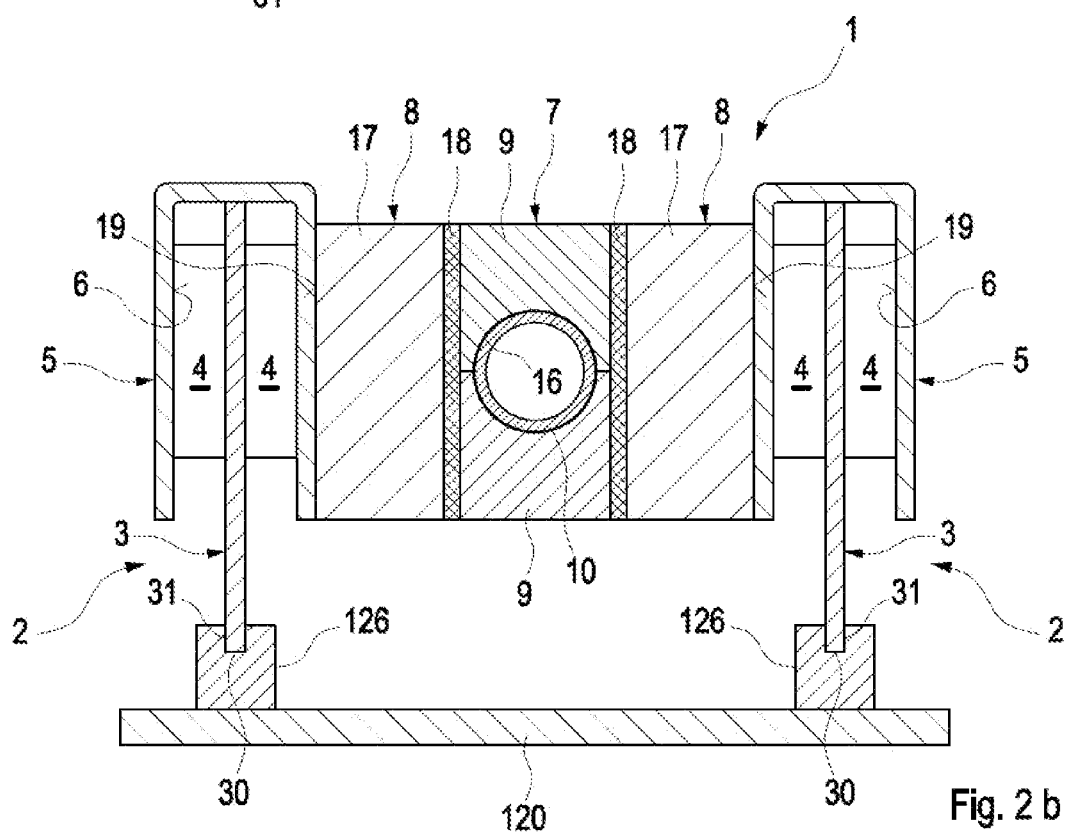
Figure 2:
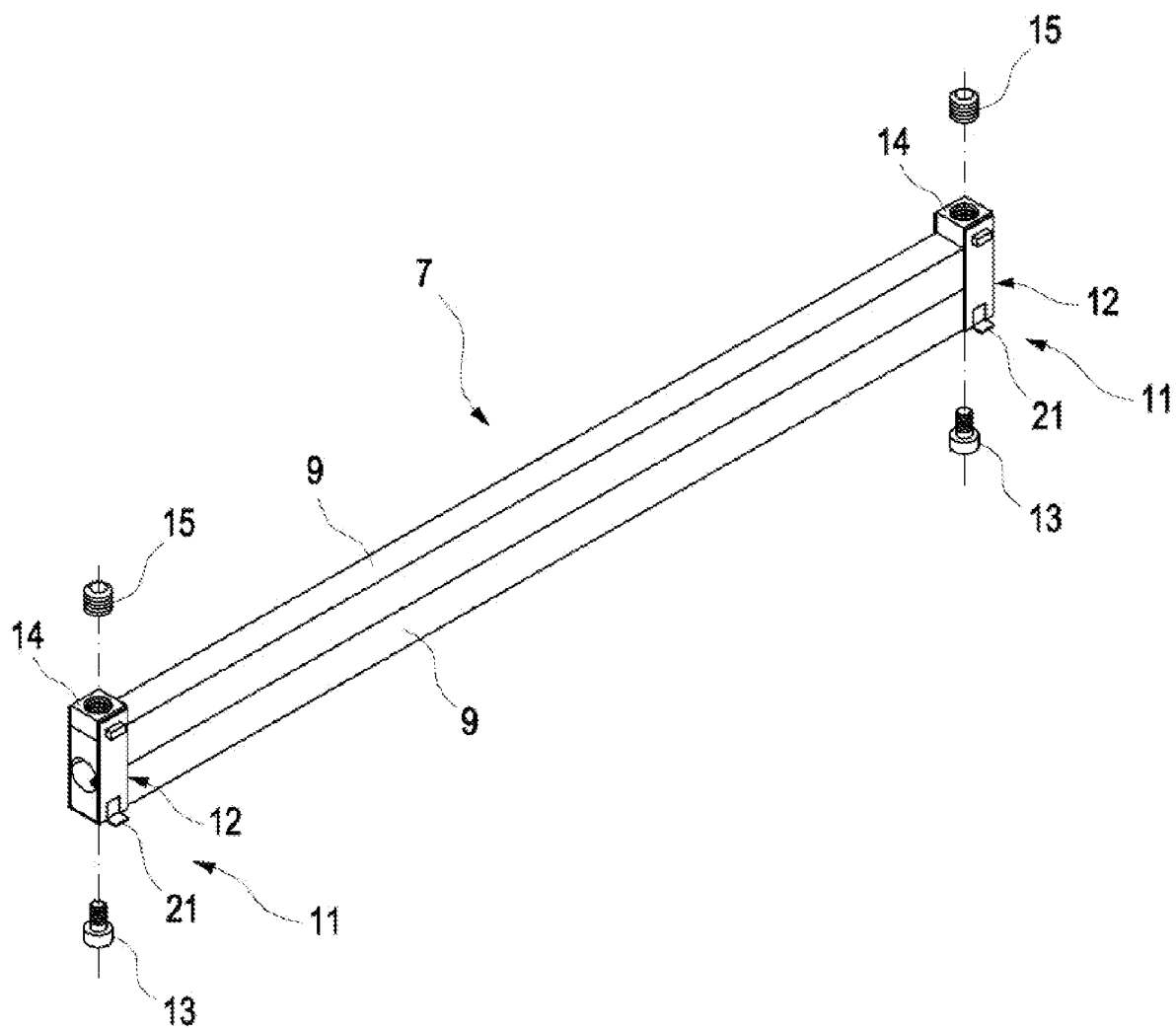

FIG. 2a shows a perspective side view and FIG. 2b a schematic sectional view of a liquid cooling device 1 according to a first embodiment of the invention. The cooling device 1 is designed for cooling two DIMMs 2 mounted in adjacent parallel sockets 126 on a motherboard 120 of an electronic device such as a workstation. Each DIMM 2 comprises a printed circuit board (PCB) 3 holding a plurality of memory modules 4 on each of its sides and an edge connector 30 with a plurality of contact pads 31 which make electrical contact with a multitude of connectors as the DIMM 2 is inserted into socket 126 on motherboard 120.

Each DIMM 2 is sheathed in a heat spreader 5 which is bent into a U-shape and slid over the top of the DIMM 2 in such a way that the inside surfaces 6 of the heat spreader 5 lie flat on the surfaces of the memory modules 4. The heat spreaders 5 may be manufactured from a sheet of a metal with a good thermal conductance, for example a copper or aluminum sheet of 1 mm thickness. Thermal grease or an elastic thermal pad is applied to the inner surfaces 6 of the heat spreaders 5 in order to ensure good thermal contact between the surfaces of the memory modules 4 and the heat spreader surfaces 6 facing them.

The cooling device 1 comprises a cold rail block 7 located in the gap between the two physically parallel DIMMs 2, as well as thermal adapters 8 bridging the gaps between the cold rail block 7 and the heat spreaders 5 mounted on the DIMMs 2.

The cold rail block 7 comprises two cold rail sleeves 9 sandwiching a tube 10 through which a cooling fluid, e.g. water, oil or a (compressed) gas, is conducted. A detailed view of the cold rail block 7 is shown in FIG. 2c. The cold rail sleeves 9 are clamped to the tube 10 (which is not shown in FIG. 2c) using bracket assemblies 11 located on the far ends of the cold rail sleeves 9. In the embodiment of FIG. 2c, the bracket assemblies 11 comprise bracket bodies 12 which are attached to the cold rail block 7 using hexagonal socket screws 13 as well as bracket top sections in the shape of clamp nuts 14. The cold rail sleeves 9 are pressed onto the tube 10 by fastening set screws 15 in these clamp nuts 14. Thermal grease is spread on the interface 16 (See FIG. 2b) between the tube 10 and the cold rail sleeves 9, thus assuring good thermal contact.

Interleaved between the cold rail block 7 and the heat spreaders 5 are thermal adapters 8. The thermal adapters 8 are elastic (reversibly compressible) in the sense that its thickness will decrease (locally) as (local) pressure is exerted on the thermal adapter 18, but will return to its original shape as the pressure subsides.

Retention brackets 20 (See FIG. 2a) span the heat spreaders 5, thermal adapters 8 and the cold rail block 7 and hold them in position by clamping and compressing them in a direction perpendicular to the plane of the DIMMs 2, thus ensuring good mechanical and thermal contact between the components 5, 7, 8 of the cooling device 1. The retention brackets 20 are elastic and act as compression springs causing the compressible thermal adapters to be pressed onto the sides of the cold rail block 7, while the heat spreaders 5 covering the DIMMs 2 are pressed onto the sides of the thermal adapters 8.

The thermal adapters 8 have a high thermal conductivity and are compressible in a direction vertical to the plane of the DIMMs' circuit boards 3. Due to this compressibility, the thermal adapters 8 can be squeezed to an adequate thickness by the retention brackets 20 which exert a compression, thus adjusting for positional inaccuracies of the DIMMs 2 as well as the remaining components 5, 7, 8 of the cooling device 1.

In the embodiment of FIGS. 2a and 2b, each thermal adapter 8 is made up of a compressible thermal pad 18 mounted to a rigid shim 17. The thermal pad 18 possesses an inherent compressibility and flexibility which enables it to recede and to compensate for dimensional inaccuracies of the thermal adapter 8 as well as of the DIMMs 2 and/or their heat spreaders 5. The thermal pad's 18 surfaces are sticky, so that the thermal pad 18 is attached to the cold rail block 7 and holds the shim 17 in position relative to the cold rail block 7. In a preferred embodiment, the thermal pad 18 may be made up of Laird Technologies' Tflex™ material, for example Tflex 300. Tflex 600 or Tflex 700. In an alternate preferred embodiment, the thermal pad may be a Bergquist's Gap Pad 3000S30 material, which is a soft gap filling material with a thermal conductivity of 3 W/m-k.

The thickness of the shim 17 depends on the spacing of the sockets 126 on the motherboard 120 and may vary from about 0.1 millimeter to several millimeters. The shim 17 may be made up of any thermally conducting material, such as copper or aluminum. If the shim 17 is very thin, it may also be made out of steel. The shim 17 is supported and held in place by catches 21 on the bottom of the cold rail block brackets bodies 12 (see FIG. 2c). The shim surface 19 (see FIG. 2b) facing the heat spreader 5 is smooth, which allows the heat spreader 5 to be displaced relative to the shim 17 without exerting much effort. In order to reduce friction between the shim surface 19 and the heat spreader 5, a coating of high viscosity silicone oil may be deposited on the shim surfaces 19, thus ensuring good thermal contact as well as facilitating sliding of the heat spreader 5 relative to the thermal adapter 8 during mounting and dismounting of the DIMM 2.

The compressibility and flexibility of the thermal pads 18 permits an easy and time-effective exchange of a DIMM 2 that does not require any tooling: When one (or both) of the DIMMs 2 is to be removed, the retention brackets 20 are lifted off the cooling assembly 1, and the DIMM 2, together with the heat spreader 5 surrounding it, is taken out of its socket 126 on the motherboard 120 while the cold rail block 7 and thermal adapters 8 remain in place on the motherboard 120. As the DIMM 2 and the heat spreader 5 are removed from the motherboard 120, the heat spreader 5 glides along the surface 19 of the shim 17, and the shim 17 stays in position since it is attached to the thermal pad 18 which sticks to the cold rail block 7. Subsequently, a new DIMM 2, also sheathed in a heat spreader 5, is slid along the outside surface 19 of the shim 17 and plugged into the socket 126 of the motherboard 120. Before introducing the new DIMM 2, a thin film of high viscosity oil with reasonable thermal conductance is spread on the surface 19 of the shim 17 facing the new DIMM 2, thus ensuring low friction and good thermal conductance. In order to facilitate mounting of the new DIMM 2, the heat spreader 5 may exhibit a small wedge on its bottom corner which presses the thermal adapter 8 toward the cold rail block 7 during the plugging operation. Once the new DIMM 2 has been plugged into its socket 126 and the retention bracket 20 has been put into place, the thermal path between the memory modules 4 on the DIMM 2 and the cold rail block 7 is closed.

Note that since the cold rail block 7 is located in the gap between adjacent DIMMs 2 and since the heat spreaders 5 sheathing the DIMMs 2 add very little height (only about 1 mm), the cooling device 1 of FIGS. 2a-2c uses up very little space above the DIMMs 2. Thus, the cooling device 1 is well-suited for usage in Server Blades or thin rack mounted servers where the free space over the top of the DIMMs 2 is very limited.

Note also that while the cooling device 1 of FIGS. 2a-2c is shown to span two DIMMs 2, the cooling device could easily be extended to cooling three or more DIMMs 2. In this case, a cool rail block 7 is interleaved between each pair of adjacent DIMMs 2, and the retention bracket 20 may be dimensioned in such a way that it spans the whole set of DIMMs 2 to be cooled.

Figure 3:
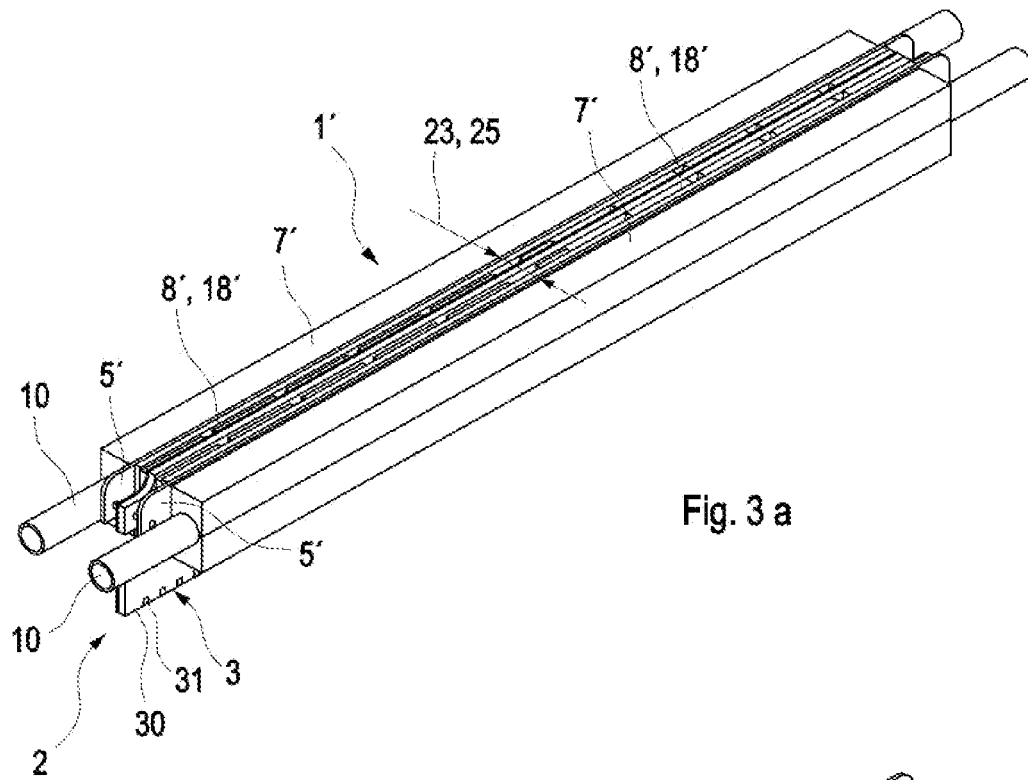
Figure 3:
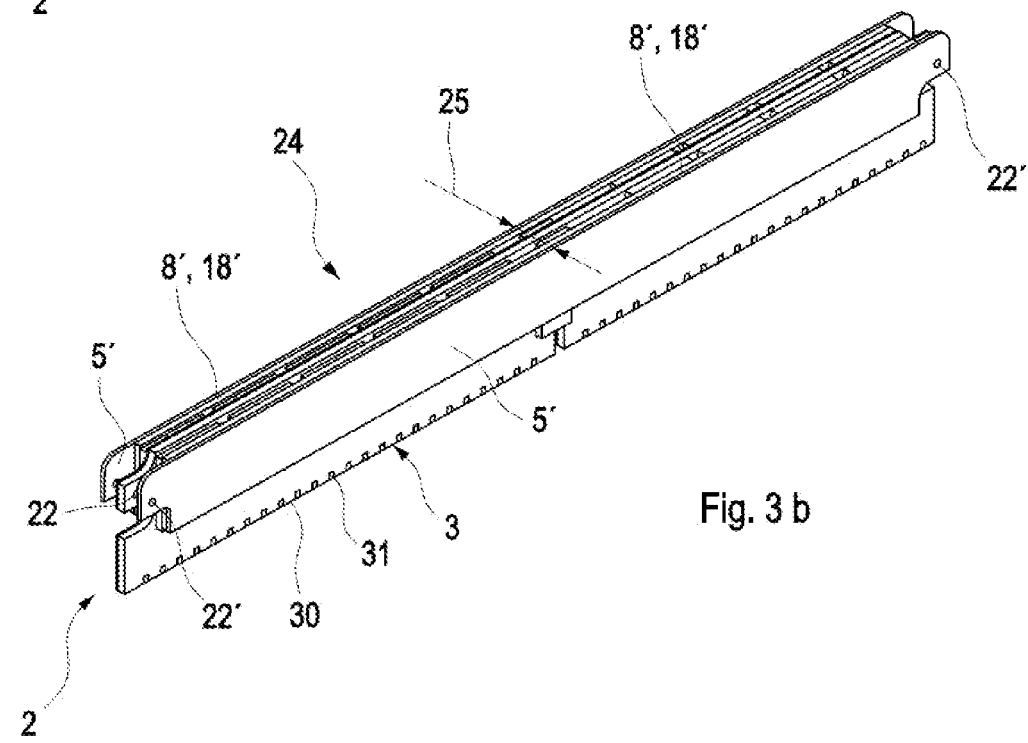

FIGS. 3a and 3b show an alternate embodiment of the invention. Whereas the cooling device 1 depicted in FIGS. 2a-2c is designed to provide cooling to two (or more) DIMMs 2, the cooling device 1' of FIGS. 3a and 3b is designed for cooling only one DIMM 2. As is shown in FIG. 3a, the cooling device 1' comprises two parallel cold rail blocks 7' which are positioned on the motherboard 120 in such a way that the DIMM 2 to be cooled can be introduced between them and is sandwiched between them. The cold rail blocks 7' correspond to the cold rail blocks 7 shown in FIG. 2c, in that the cold rail blocks 7' also comprise tubes 10 in which a cooling fluid such as water, water vapor, oil etc. is conducted. The cooling device 1' comprises two flat heat spreaders 5' attached to each side of the DIMM 2 that is to be cooled. Compressible thermal adapters 8' in the shape of compressible thermal pads 18' are interleaved between the DIMM 2 and the heat spreaders 5' on both sides of the DIMM 2. The thermal pads 18' are sticky and keep the heat spreaders 5' in position relative to the DIMM 2. In order to secure the heat spreaders 5' in place, fastening pins 22 pressed into the far ends of the DIMM's 2 circuit board 3 are inserted into matching holes 22' in the heat spreaders 5', thus holding the heat spreaders 5' aligned with the sides of the circuit board 3 while allowing movements of the heat spreaders 5' in a direction perpendicular to the plane of the circuit board 3.

The cold rail blocks 7' are rigidly mounted to the motherboard 120, forming a gap 23 between them into which a sheathed DIMM assembly 24 comprising DIMM 2, heat spreaders 5' and thermal pads 18' (see FIG. 3b) is to be inserted. The thickness of the thermal pads 18' is dimensioned in such a way that the thermal pads 18' are slightly compressed when this sheathed DIMM assembly 24 is located in the gap 23 between the cold rail blocks 7'. The cold rail blocks 7' exert pressure on the outsides of the heat spreaders 5' which in turn compress the thermal pads 18' and press them onto the DIMM modules 4 (See FIG. 2b). This ensures a good mechanical and thermal contact of the interfaces between DIMM modules 4, thermal pads 18', heat spreaders 5' and cold rail blocks 7'. Depending on the way in which the cold rail blocks 7' are mounted on the motherboard 120, elastic retention clamps similar to the ones shown in FIG. 2a may be used in order to ensure that the cold rail blocks 7' exert a predetermined pressure on the outsides of the heat spreaders 5'.

If the DIMM 2 needs to be exchanged, the sheathed DIMM assembly 24 comprising DIMM 2, thermal pads 18' and heat spreaders 5' is pulled out of the gap 23 between the cold rail blocks 7'. The pins 22 on the DIMM 2 engaging into holes 22' of the heat spreaders 5' ensure that this assembly 24 can be withdrawn as a whole. In order to effectuate easy withdrawal of sheathed DIMM assembly 24, a film of silicone oil of high viscosity is placed between the cold rail blocks 7' and the heat spreaders 5'. The silicone oil acts as thermal contact and supports the gliding motion during the insertion or removal of the DIMM 2. In order to put a new DIMM 2 into place on the motherboard 120, the DIMM 2 is equipped with thermal pads 18' and heat spreaders 5', thus forming the sheathed DIMM assembly 24 shown in FIG. 3b. By manually exerting a pressure on the outside faces of the heat spreaders 5', the thermal pads 18' are compressed thus decreasing the thickness 25 of the sheathed DIMM assembly 24 until it can be inserted into the gap 23 between the two cold rail blocks 7' and the edge connector 30 of the DIMM 2 can be introduced into its corresponding socket 126 in the motherboard 120.

Note that the cooling system 1' of FIGS. 3a and 3b does not extend beyond the height of the DIMM 2, so that it takes up no extra space on top of the DIMM 2. Thus, it is especially well-suited for use in Server Blades or thin rack mounted servers where the free space above the top of the DIMMs is very limited.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed.

The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A liquid cooling device, comprising:
   a first heat spreader disposed along a plurality of memory modules on a first dual in-line memory module;
   a second heat spreader disposed along a plurality of memory modules on a second dual in-line memory module that is adjacent and parallel to the first dual in-line memory module;
   a cold rail block extending along the heat spreader, wherein the cold rail block is positioned in a gap between the first and second dual in-line memory modules for cooling the first and second dual in-line memory modules without extending above the first and second dual in-line memory modules, and wherein the cold rail block includes a tube through which a cooling fluid is passed;
   a first compressible thermal adapter positioned between the cold rail block and the first dual in-line memory module; and
   a second compressible thermal adapter positioned between the cold rail block and the second dual in-line memory module.

2. The cooling device of claim 1, wherein the first and second compressible thermal adapters each comprise a compressible thermally conducting pad fastened to a rigid shim.

3. The cooling device of claim 2, wherein the compressible thermally conducting pad is disposed in contact with the cold rail block.

4. The cooling device of claim 1, further comprising:
   a retention bracket spanning the first and second heat spreaders, the cold rail block and the first and second compressible thermal adapters and exerting a compression force fastening together the first and second heat spreaders, the cold rail block and the first and second compressible thermal adapters.

5. The cooling device of claim 1, further comprising:
   a fixture holding the first compressible thermal adapter in place relative to the cold rail block or relative to the first dual in-line memory module.

6. The cooling device of claim 5, wherein the fixture is formed by catches protruding outward from the cold rail block.

7. The cooling device of claim 1, wherein the first compressible thermal adapter and the first heat spreader are in contact along smooth contact surfaces that permit low-friction gliding of the heat spreader relative to the thermal adapter.

8. The cooling device of claim 7, further comprising:
   a low-friction lubricant spread on the smooth contact surfaces.

9. The cooling device of claim 1, wherein the cold rail block comprises two cold rail sleeves sandwiching the tube.

10. The cooling device of claim 1, wherein the first heat spreader is bent into a U-shape and disposed over the top of the first dual in-line memory module, and wherein the second heat spreader is bent into a U-shape and disposed over the top of the second dual in-line memory module.

11. A liquid cooling device, comprising:
- a heat spreader disposed along a plurality of memory modules on a dual in-line memory module;
- a cold rail block extending along the heat spreader, wherein the cold rail block comprises two cold rails sleeves sandwiching a tube, and wherein the two cold rail sleeves are clamped to the tube using bracket assemblies located on the far ends of the cold rail sleeves; and
- a compressible thermal adapter interleaved between the cold rail block and the memory modules.

* * * * *